United States Patent
Westra et al.

(10) Patent No.: US 12,537,538 B2
(45) Date of Patent: Jan. 27, 2026

(54) CALIBRATION OF A DIGITAL-TO-ANALOG CONVERTER

(71) Applicant: Avago Technologies International Sales Pte. Limited, Singapore (SG)

(72) Inventors: Jan Roelof Westra, Uithoorn (NL); Mohammadreza Mehrpoo, Eindhoven (NL); Frank van der Goes, Zeist (NL)

(73) Assignee: Avago Technologies International Sales Pte. Limited, Singapore (SG)

( * ) Notice: Subject to any disclaimer, the term of this patent is extended or adjusted under 35 U.S.C. 154(b) by 185 days.

(21) Appl. No.: 18/479,019

(22) Filed: Sep. 30, 2023

(65) Prior Publication Data

US 2024/0063807 A1  Feb. 22, 2024

Related U.S. Application Data

(63) Continuation-in-part of application No. 17/891,871, filed on Aug. 19, 2022, now Pat. No. 12,407,360, and a continuation-in-part of application No. 17/889,877, filed on Aug. 17, 2022, now Pat. No. 12,218,677.

(51) Int. Cl.
*H03M 1/10* (2006.01)

(52) U.S. Cl.
CPC ................. *H03M 1/1014* (2013.01)

(58) Field of Classification Search
CPC ..... H03M 1/1014; H03M 1/1023; H03M 1/12
USPC .......... 341/144, 155, 143, 118, 120
See application file for complete search history.

(56) References Cited

U.S. PATENT DOCUMENTS

| | | | |
|---|---|---|---|
| 9,397,677 B1 * | 7/2016 | Abramzon | H03M 1/1033 |
| 9,509,326 B1 * | 11/2016 | Kauffman | H03M 1/1009 |
| 10,516,412 B1 * | 12/2019 | Mehdizad Taleie | H03M 1/662 |
| 2024/0162921 A1 * | 5/2024 | Chakraborty | H04B 1/0028 |

* cited by examiner

*Primary Examiner* — Peguy Jean Pierre
(74) *Attorney, Agent, or Firm* — King Intellectual Asset Management

(57) ABSTRACT

Novel solutions for calibration of a digital-to-analog converter (DAC). Some solutions allow for the calibration of a DAC without an isolation switch and/or calibration based on signal measurements taken at the output stage of a device comprising the DAC.

20 Claims, 10 Drawing Sheets

1

CALIBRATION OF A DIGITAL-TO-ANALOG CONVERTER

CROSS-REFERENCES

This application is a continuation-in-part of the following applications, each of which is incorporated herein by reference for all purposes: U.S. patent application Ser. No. 17/891,871, filed Aug. 19, 2022, by Mulder et al. and titled, "Circuit and Method for Calibration of a Digital-to-Analog Converter" (the "'871 Application"); and U.S. patent application Ser. No. 17/889,877, filed Aug. 17, 2022, by Mulder et al. and titled, "Circuit and Method for Calibration of a Digital-to-Analog Converter" (the "'877 Application") (collectively, the "Incorporated Applications.")

TECHNICAL FIELD

This disclosure generally relates to digital-to-analog converters, and more particularly to calibration of digital-to-analog converters.

BACKGROUND

A digital-to-analog converter (DAC) is a device that converts a digital signal into an analog signal. Digital signals represent data with a fixed number of values and are commonly used by computers and other electronic devices because they easily represent binary data with either a high value (e.g., 1V) or a low value (e.g., 0V) and are relatively impervious to interference, as compared to analog signals. An analog signal, on the other hand, represents data along continuum and can more precisely represent data collected from, or output to, the physical world (e.g., image data, video data, sensor data, etc.) because such data is continuous and must be quantized to obtain a digital signal. In a simple sense, quantization truncates least significant digits of an analog value and therefore results in relative a lack of precision.

A DAC can serve as a bridge between the digital world to the physical world. For example, when stored as digital data, audio must be converted from digital to analog in order to drive a speaker to produce sound. Similarly, when modulating digital data for transmission on a carrier wave (which is an analog signal), the digital data must be converted to analog data for transmission. A DAC is commonly used for such operations. (The inverse operation is often performed by an analog-to-digital converter, or ADC, when encoding music digitally for storage or for decoding analog signals received from another device.)

A high-performance DAC often comprises a plurality of DAC cells. In many cases, these cells require calibration to ensure that the composite analog signal produced by the DAC cells maintains significant fidelity to the digital signal being converted.

DETAILED DESCRIPTION

Various embodiments provide enhanced solutions for calibration of a DAC. In accordance with some embodiments, these solutions can mitigate the negative effects of interfering signals produced by other electrical components. In other aspects, certain embodiments allow for the calibration of a DAC without isolating the DAC from other components, which can help to provide more accurate calibration of the DAC in situ, rather than in isolation.

Figure 1:
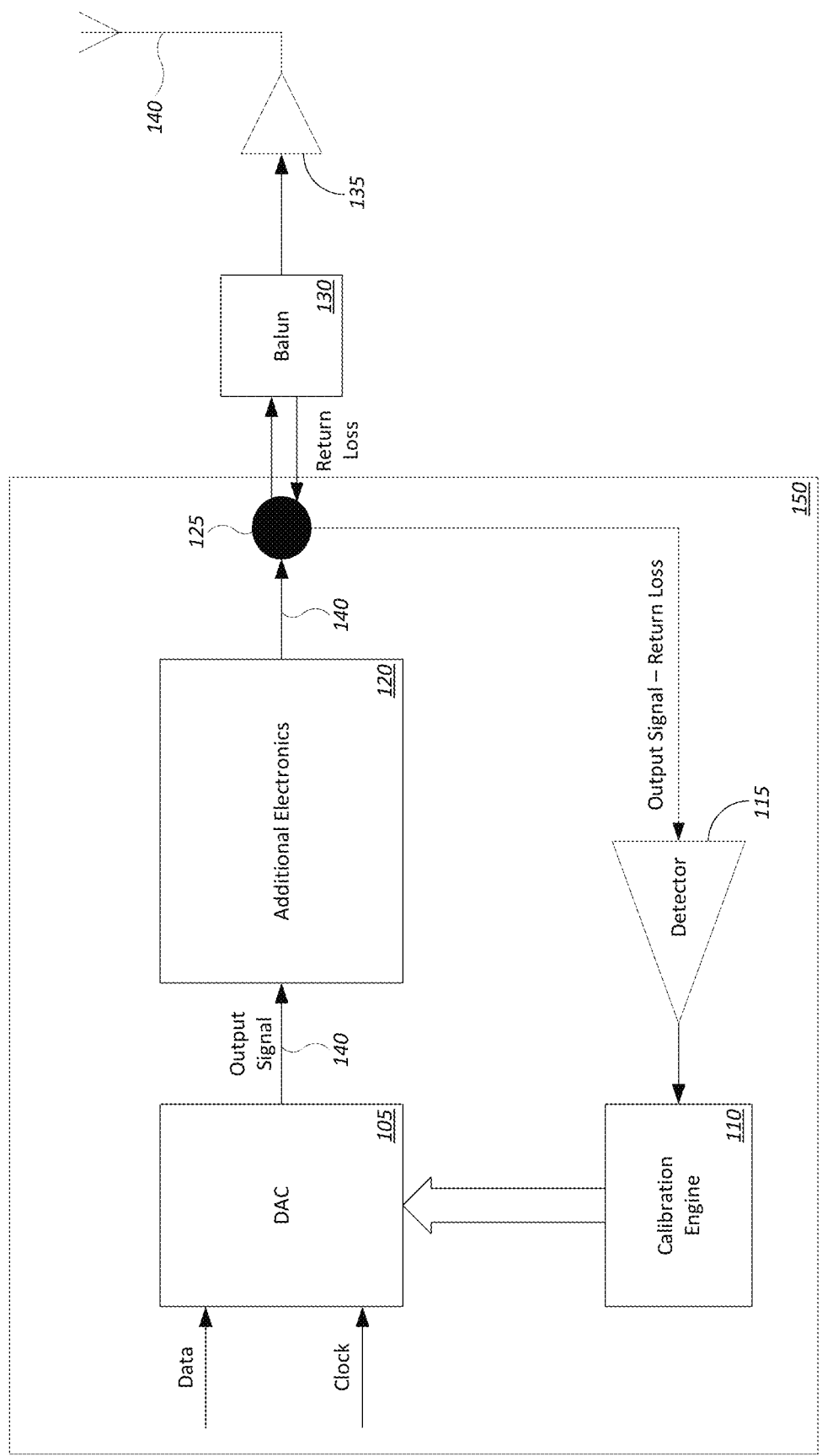
FIG. 1 is a block diagram of a transmitter comprising a DAC calibration system, in accordance with various embodiments.

For instance, FIG. 1 is a block diagram of a transmitter 100 comprising a DAC calibration system, in accordance with various embodiments. The transmitter 100 comprises a DAC 105, a calibration engine 110, a detector 115, and various additional electronics 120. In some cases, the DAC 105, calibration engine 110, detector 115, and any additional electronics 120 to process the DAC output signal are incorporated within a device 150. Such a device 150 can be any type of device capable of performing the DAC calibration functionality described herein. Examples of such devices can include, without limitation, a semiconductor device, an integrated circuit, an application specific integrated circuit (ASIC), a system on a chip (SoC) or the like. The calibration engine 110 can include any components or logic to perform operations for calibrating a DAC 105 as described herein. In some cases, the calibration engine might be a discrete component; in other cases, it might be a collection of individual components, circuits and/or logic. In an aspect, the calibration engine 110 can calibrate the DAC 105 (or components thereof, such as DAC unit cells, not shown in FIG. 1), e.g., based on measurement of errors in the output signal from the DAC. As used herein, the term "calibrate" can encompass any actions or operations that adjust the performance of a DAC or a DAC cell. In a particular aspect, calibration is performed to improve the overall performance of a DAC, and it can encompass adjusting any of a number of parameters of a DAC or DAC cell (e.g., adjusting clock signal, an amplitude, timing, etc. of a DAC or cell). Various examples of calibration operations are described herein and the Incorporated Applications, but those examples should not be considered limiting.

As illustrated by FIG. 1, the signal path 140 of the analog output signal from the DAC passes through various electronic components 120 (such as matching network switches, etc.) before reaching an output stage 125 of the device 150. This output stage 125 serves as an interface between the device 150 and other components of the transmitter 100 (or whatever larger device or system incorporates or employs the device 150). In an aspect, the output signal can include any distortion, return loss, etc. imposed by the internals of the device 150 (e.g., the additional components 120), such that the output signal at the output stage 125 represents the signal as it will be provided to other components outside the device 150. In a sense, therefore, the signal at the output stage 125 can be used to calibrate the DAC 105 to account for any post-DAC changes to the output signal before it leaves the device 150. Often, a device 150 will be packaged on a board with other components, e.g., as illustrated by FIG. 1, transmitter components, such as a balun 130, a power amplifier 135, and/or an antenna 140. In many cases, these extra-device components (referred to herein as "board blocks") or other sources will impose an interfering signal on the DAC's output signal. As used herein, the term "interfering signal" means any signal, noise, etc. that can interfere (e.g., destructively) with the output signal from the DAC, and more specifically, any signal that can affect the measurement of that signal by the detector 115. An interfering signal can include, without limitation, return loss imposed by the board blocks. An example of a return loss is time domain reflections (TDR) generated by the balun 130 in response to the analog signal transmitted on the signal path 140 by the DAC 105. As explained in further detail below, such return loss can destructively interfere with the output signal of the DAC 105, rendering calibration of the DAC unreliable.

Figure 2:
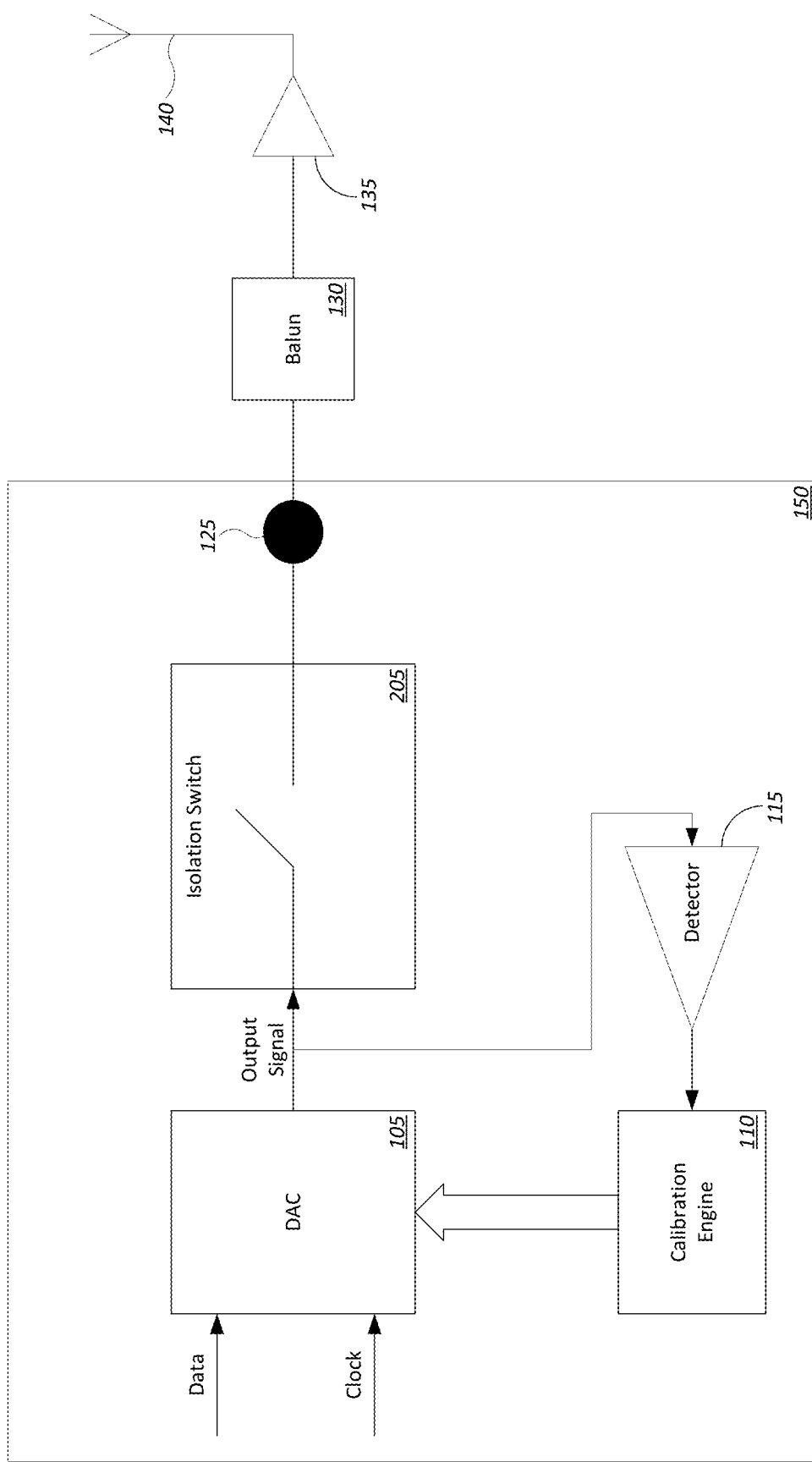
FIG. 2 is a block diagram of a transmitter comprising a DAC calibration system and a series isolation switch, in accordance with various embodiments.

FIG. 2 illustrates one solution to this issue: a transmitter 200 comprising a DAC calibration system, as illustrated in FIG. 1, along with an isolation series switch 205. To perform a reliable DAC calibration with a single detector connected to the DAC 105 output, the isolation series switch 205 can be used to isolate the board blocks from the DAC during calibration, thus creating a controlled calibration environment. This solution, which is described in detail below and in one or more of the Incorporated Applications, eliminates the return loss of the board blocks, including the balun(s) 130 (and any other components on the signal path), by interrupting the circuit with the isolation switch. This can avoid any return loss from the board blocks, e.g., a balun, which is unknown and can vary substantially, e.g., from balun to balun. In some cases, however, this isolation switch 205 can impose a few limitations, including without limitation loss of signal power, potential electrostatic discharge issues, and/or issues with return loss. But without an isolation switch, the return loss from the board blocks and/or other components can prevent reliable calibration, as noted above.

Figure 3A:
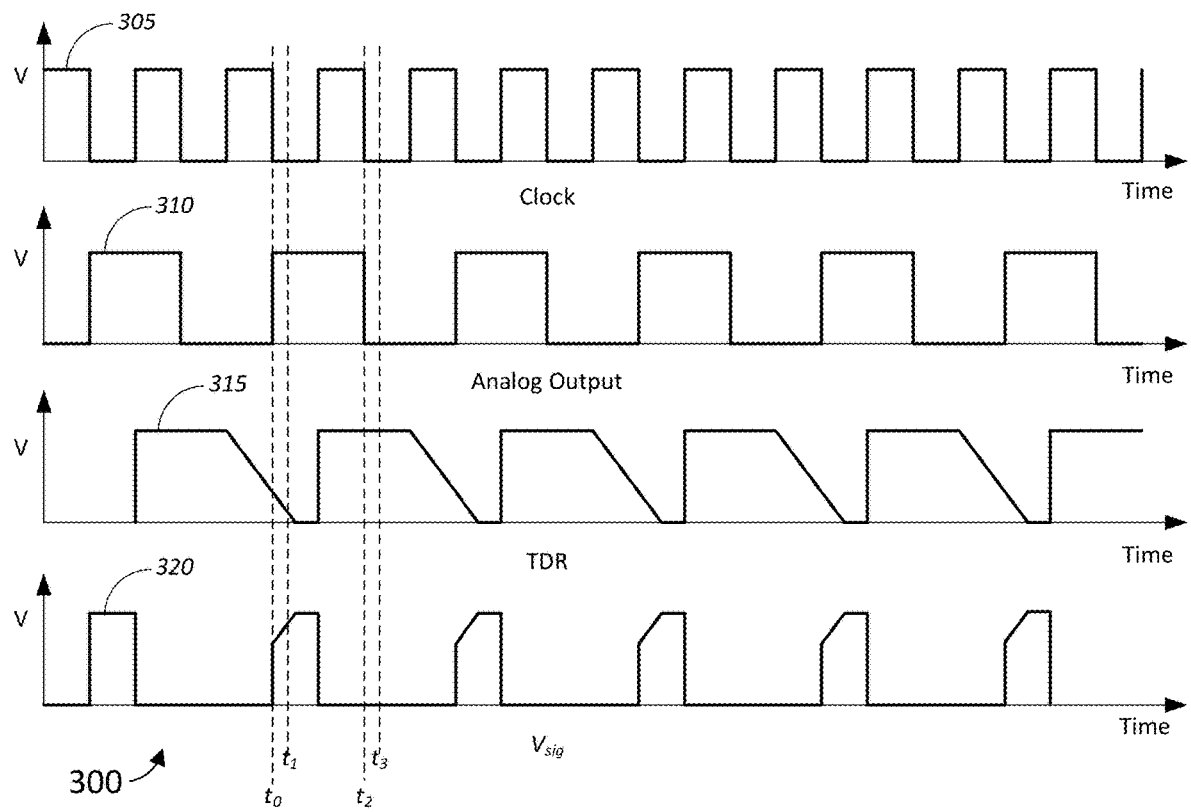
FIGS. 3A and 3B are timing diagrams showing two DAC calibration techniques, in accordance with various embodiments.
Figure 3B:
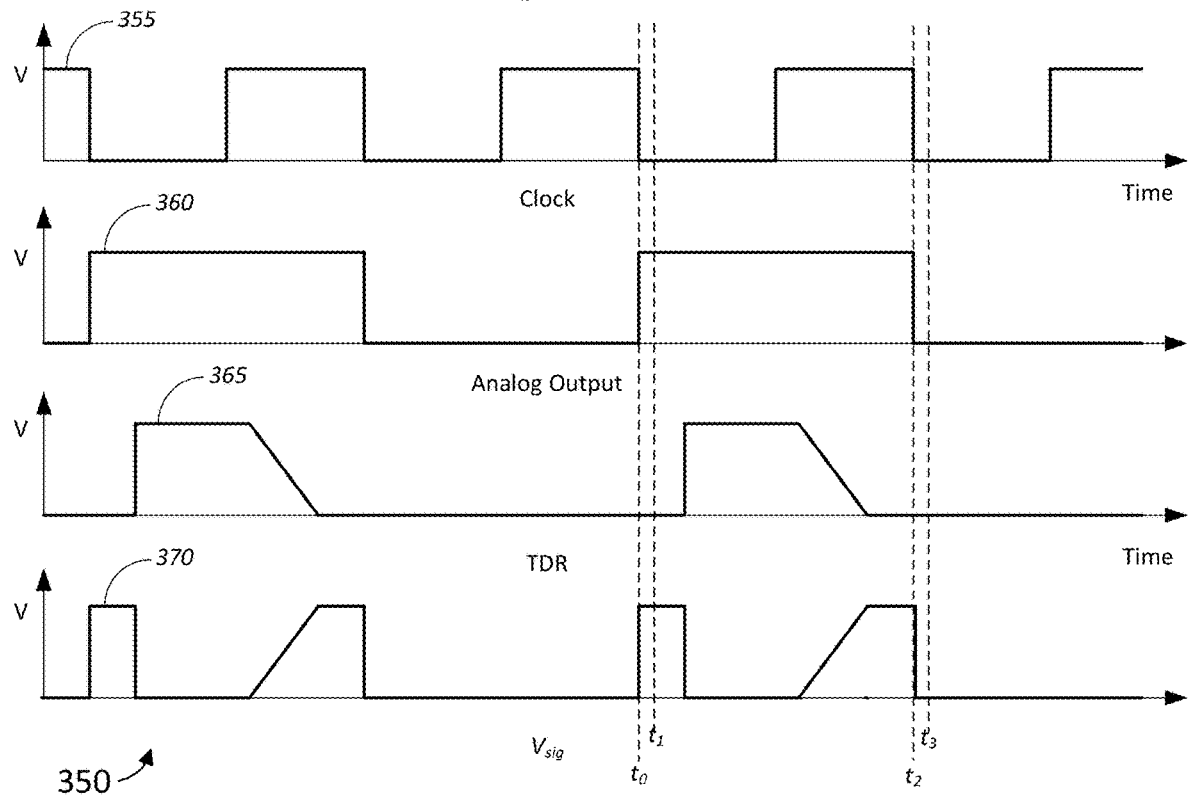

To illustrate the deleterious effects of return loss on DAC calibration, FIGS. 3A and 3B are timing diagrams showing examples of two DAC calibration techniques, in accordance with various embodiments. FIG. 3A illustrates a calibration procedure without an isolation switch (or any other mitigation of return loss). As shown in FIG. 3A, a clock signal 305 controls the rate at which the DAC converts a digital data signal, to produce an analog output signal 310. As used herein, the term "clock signal" or "clock" means any signal or control that imposes a timing on an activity. Such activities can include, as here, generation of an analog signal by a DAC (or DAC cell, as discussed below) converting an input digital data signal. Such activities can also include the measurement (e.g., sampling, detecting, etc.) of a signal or its characteristics by a detector or other device. In an aspect, a clock signal can be implemented as a logic signal (e.g., represented by voltage or current) that oscillates between a high and a low state. In some embodiments, this oscillation occurs on a fixed frequency and thereby imposes the fixed timing on the activity being controlled by the clock.

Thus, the output signal 310, in some embodiments, can be a fixed-frequency analog signal with regular edges and amplitude. This output signal 310, however, induces a return loss (e.g., TDR) 315, which destructively interferes with the output signal 310, producing a measured output signal with an amplitude and timing (e.g., edges) expressed as $V_{sig}$ 320, as shown. Essentially, the interference from the return loss 315 can subtract from (and in some cases, effectively nullify) the voltage of the output signal 310, resulting in substantial disparity between the waveform of $V_{sig}$ 320 and that of the DAC output signal 310. As described further below, two exemplary characteristics of a DAC output signal that can be calibrated are amplitude and timing. The effect of the return loss 315 on $V_{sig}$ 320 are apparent from FIG. 3A: For much of the timeline, the DAC output 310 is high (e.g., 1V), but the return loss 315 destructively interferes with the analog output signal 310, resulting in $V_{sig}$ 320 with a significantly modified waveform. The modified waveform cannot provide a reliable basis to calibrate the DAC because it does not reflect the true output of the DAC. On the one hand, the return loss can affect measurement of the amplitude of the output signal 310. For example, measurement of the amplitude of $V_{sig}$ 310 at time $t_1$ will result in a lower measured value than the actual output value 310 at that time. On the other hand, the effects of the TDR render detection of timing delays unreliable as well. For example, if the leading edge (rising value) of the output signal 310 occurs at $t_0$ and measured by the detector 115 at time $t_1$, the change in value of $V_{sig}$ 320 is much smaller than the change in value of the output signal 305 and may not be detected. Even worse, the trailing edge (falling value) in the output signal 305, which occurs at time $t_2$, cannot be detected at all at time $t_3$, because the return loss 315 has nullified the output voltage altogether, so there is no edge in $V_{sig}$ to be measured. The use of an isolation series switch 205 can mitigate these problems because it effectively removes the balun from the circuit, eliminating the return loss therefrom.

As explained below in detail, however, some embodiments employ a different technique for mitigating the issues created by return loss. As used herein, the term "mitigate" means any operation that has the purpose or effect of avoiding, reducing, or compensating for the negative effects of an interfering signal. Examples include, but are not limited to, the techniques described in further detail below. For example, by adjusting the timing of a DAC output stream 360, the return loss from board blocks can be mitigated while still allowing the DAC (or various unit cells thereof) to be calibrated in situ, without an isolation switch. As shown in FIG. 3B, for example, by adjusting the clock signal 355 driving the DAC (or unit cell), the timing of the positive amplitude pulses in the output signal 360 can be synchronized so as to mitigate the effects of return loss. For instance, the return loss 315 in FIG. 3A and the return loss 365 in FIG. 3B have an identical waveform, which rises from 0V to an amplitude (which, in some cases, might be the same, or nearly the same, as the amplitude pulse of the output signal 310, 360), for example as the output signal reflects back from the balun 130 into the chip output 125 as TDR. Research has shown that the amplitude of the return loss remains high until the balun 130 becomes inductive, at which point the amplitude of the TDR begins to decrease (shown roughly as a linear decrease in FIGS. 3A and 3B).

The difference in FIG. 3B is, as noted, that the timing of the clock signal 355, and therefore the output signal 360 from the DAC 105, has been adjusted to a different pulse pattern, to take advantage of this return loss behavior. Specifically, in the embodiment shown, after the output signal 360 experiences a rising edge ($t_0$), the detector measures the signal 360 relatively (at time $t_1$), before the return 365 begins to affect $V_{sig}$. This allows the system to make a reliable measurement of the rising edge, which can be used (e.g., as described below) as part of a technique to calibrate a DAC 105 (or a DAC unit cell within a DAC). On the other hand, the pulse pattern in the output signal 360 has been slowed in order to allow the return loss 365 to dissipate before the falling edge occurs (at time $t_2$). The detector 115 then can measure the signal at that point (or shortly thereafter, at time $t_3$), when, again, there is no return loss to interfere with $V_{sig}$. As described below, a clock signal might control the timing of the measurements by the detector as well.

Figure 4:
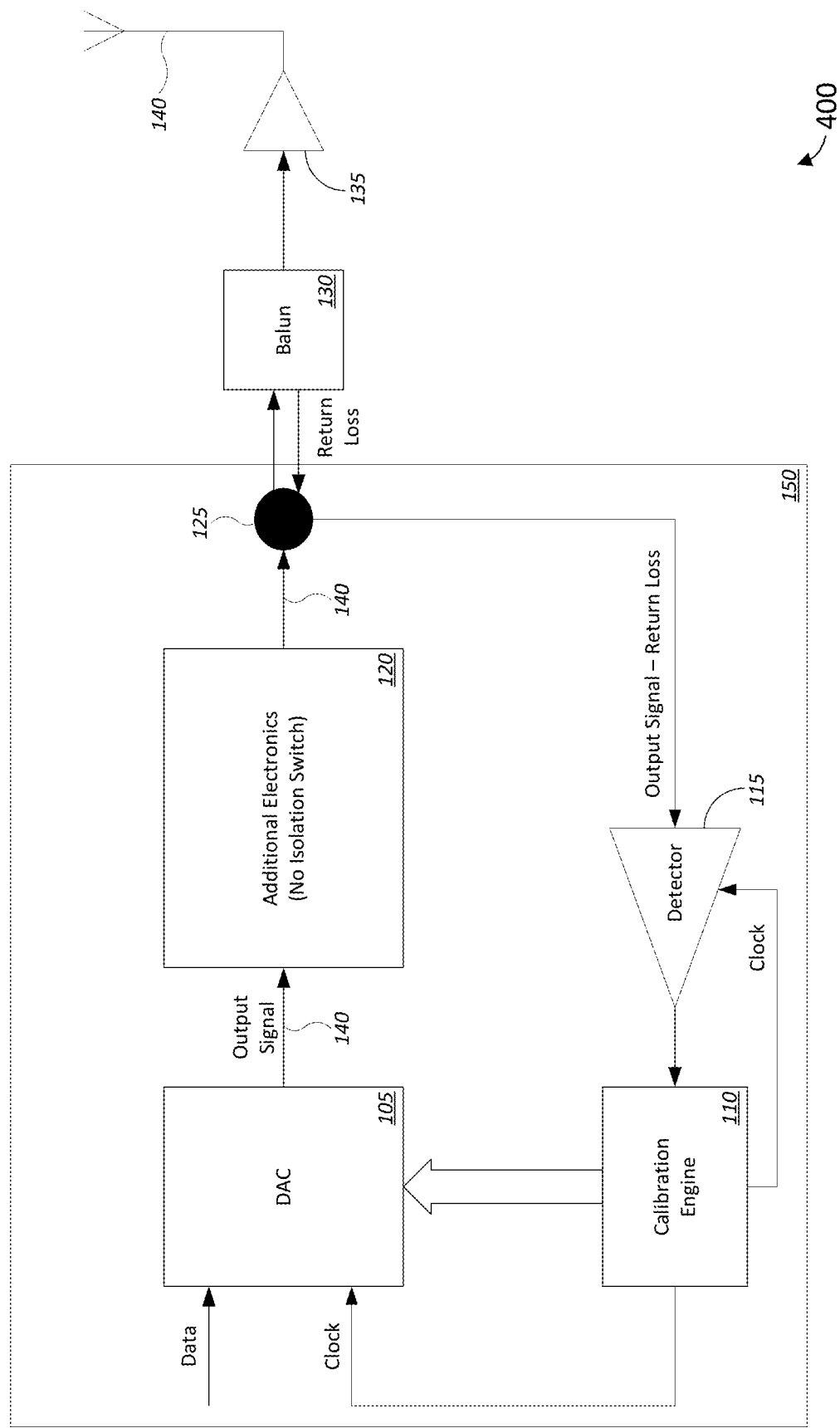
FIG. 4 is a block diagram of a transmitter without a series isolation switch, in accordance with various embodiments.

FIG. 4 is a block diagram of a transmitter 400—without an isolation series switch—that can employ this technique. The transmitter 400 is similar to the transmitter 100 of FIG. 1. The transmitter 400 includes no isolation switch, so the output signal of the DAC effectively is measured from the chip output 125 (regardless of where the signal might actually be sampled) by the detector 115. This allows for calibration of the DAC output signal without having to isolate that signal from any electronic components 120 in the signal path, which reduces circuit complexity and allows calibration of the DAC in situ. As explained below, however, the transmitter 400 can mitigate issues related to return loss without the use of an isolation switch. In the transmitter circuit 400 of FIG. 4, the detector 115 provides output to the calibration engine 110, which can adjust the DAC (e.g., as described in further detail below) to calibrate the DAC 105 or any of its unit cells. In this embodiment, however, the calibration engine also adjusts the clock signal provided to the DAC 105 and provides a clock signal to the detector 115 as well.

The clock signal provided to the detector 115 might be the same clock signal delivered to the DAC 105, might be a completely separate signal, or might be derived in some way from the clock signal provided to the detector. For example, in some embodiments, the calibration engine might provide to the detector 115 a clock signal that triggers the detector to measure the DAC output signal at a fixed time after the clock signal provided to the DAC produces a (rising and/or falling) edge. In such embodiments, therefore, the calibration engine 110 can ensure that the DAC signal is timed to allow enough time for the return loss to diminish before producing a first edge (e.g., a rising edge) while instructing the detector 115 to measure that signal at appropriates times to ensure that the output signal is measured when $V_{sig}$ is unaffected by the return loss. Examples of operations to provide this functionality, and logic to control such operations, are discussed in further detail below.

Figure 5:
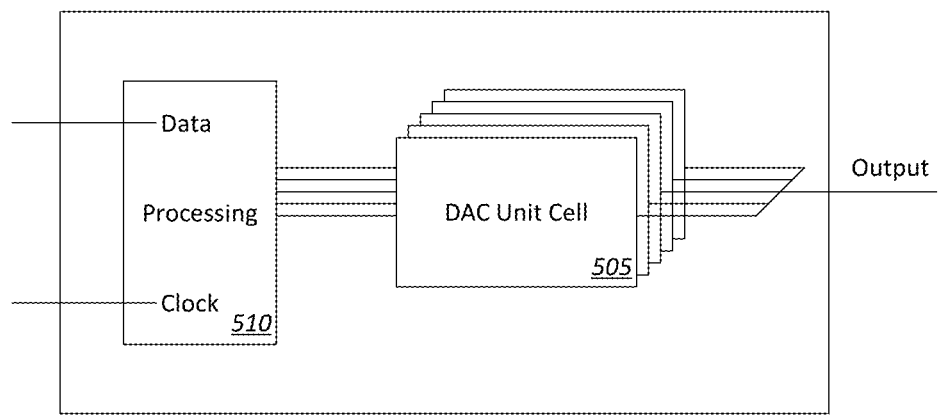
FIG. 5 is a block diagram of a DAC, in accordance with various embodiments.

FIG. 5 is a block diagram of a DAC 105, in accordance with various embodiments, which is configured to convert a digital input to an analog input. The DAC 105 includes one or more (and generally a plurality of) DAC unit cells 505 and a processing circuit 510.

The processing circuit 510 is configured to receive and/or generate a data signal and send the data signal to one or more each of the DAC unit cells 505 and also produce (or receive from the calibration engine) a clock signal, which regulates the timing of each of the individual DAC unit cells 505. As used herein, the term, "DAC unit cell" (also referred to herein as a "DAC cell" or simply a "cell"), refers to a unit circuit having a set of components in a particular arrangement. In operation of the DAC 105, each DAC unit cell 505 might receive a respective bit of multiple bits of data provided by the processing circuit 510, and provide a current, voltage or power corresponding to the received one bit. In one aspect, currents from different DAC cells can be combined to represent the multiple bits of data. For example, an amplitude of the combined current in an analog representation may correspond to the multiple bits of data in a digital representation. In one aspect, calibration of each DAC cell 505 can reduce errors in the operation of the DAC 105.

The DAC unit cells 505 each may output an analog signal, e.g., a current signal of varying amplitude (volts). In some cases, the DAC 105 (or components thereof, such as the processing circuit 510) can be controlled by logic in a calibration engine 110 (not shown in FIG. 5) and/or other circuitry. As noted, in some cases, the DAC 105 operates to receive N-bit data as a digital signal and provide analog signals in an analog representation corresponding to the N-bit data in the digital signal. Thus, the DAC unit cells 505 might receive data from the processing circuit 115 in a digital format and then output the data in an analog format. In some embodiments, the output signal from the DAC unit cells 505 may be in the form of a current signal and/or a voltage signal.

Merely by way of example, in some embodiments, a DAC cell includes a bias control circuit, a driver circuit (or a latch), and a current steering circuit. The bias control circuit can provide one or more bias voltages for configuring the driver circuit and the current steering circuit. A bias voltage can be a voltage to set an amount of current flow or a drive strength (e.g., transconductance, or an amount of change in a current provided, in response to a change in a voltage applied). A driver circuit can provide a second signal having a first edge, based on a first signal (e.g., bias voltages) from the bias control circuit. An edge of a signal may be a change in a state of the signal from one state to another state. As noted above, a rising edge may be a change from a low state (a smaller or zero amplitude e.g., 0V) to a high state (e.g., a larger amplitude, such as 1V), and a falling edge may be a change from a high state to a low state. The first edge of the second signal may be set or adjusted, according to the drive strength of the driver circuit. For example, the second signal may have a faster edge by increasing the drive strength of the driver circuit. In one aspect, the driver circuit includes an adjustable current source that can set a drive strength, according to the first signal (e.g., bias voltages). In one aspect, the current steering circuit may be a circuit configured to generate or provide a current corresponding to one bit of data. The current steering circuit may be configured to generate a third signal having a second edge, in response to the first edge of the second signal.

In particular embodiments, a DAC 105 can include one or more DAC unit cells 505, a processing circuit 510, and an accurate reference or reference cell for calibrating the DAC unit cells. In operation, each of the DAC unit cells 505 might produce analog signals with different characteristics than signals produced by other cells; such characteristics can include, inter alia, amplitude, rising edge, and falling edge of a signal output from the cell. Generally, high-performance DACs require calibration of their DAC unit cells so that all cells behave as similarly as possible, in some cases, with characteristics that are identical or nearly identical in material respects (e.g., amplitude, rising edge and falling edge timing, etc.). In an aspect, calibration of DAC unit cells 505 can employ an objective reference, such as a reference value and/or reference cell.

The term "reference cell" is used herein to refer to a cell designated by the calibration system as the cell to which all other cells 505 of the DAC 105 are calibrated. These other cells are referred to herein as "duty cells," to distinguish them from the reference cell. For example, in some embodiments, one of the cells 505 in the DAC 105 might be designated as a reference cell. This reference cell produces a reference output signal, and all of the other cells are thereafter calibrated against the reference cell. The calibration process is discussed further below, but in brief, the output signal of each duty cell in the DAC 105 is compared individually with the reference signal (i.e., the output signal of the reference cell), and the operation of the duty cell is adjusted until the output signal of that cell matches the reference signal.

As used herein, the term "match" means that an entity (e.g., an output signal, a DAC cell, etc.) has material characteristics (e.g., amplitude, timing, etc. of an output signal) that are similar to that of a corresponding entity to within an applicable tolerance. The tolerance can depend on the embodiment; in some cases, it might be predetermined, but any tolerance (including zero tolerance, i.e., identity within measurable standards) is possible. Generally, the tolerance might require sufficient similarity of characteristics to provide acceptable overall performance of the DAC. Thus, matching signals and/or DAC cells need not be identical unless the standard of tolerance for that embodiment requires identity.

In some embodiments, the calibration techniques require no external cells or other components (e.g., other than a calibration engine and/or a detector). Similarly, some embodiments require no specialized circuitry inside each DAC unit cell to perform calibration.

Figure 6:
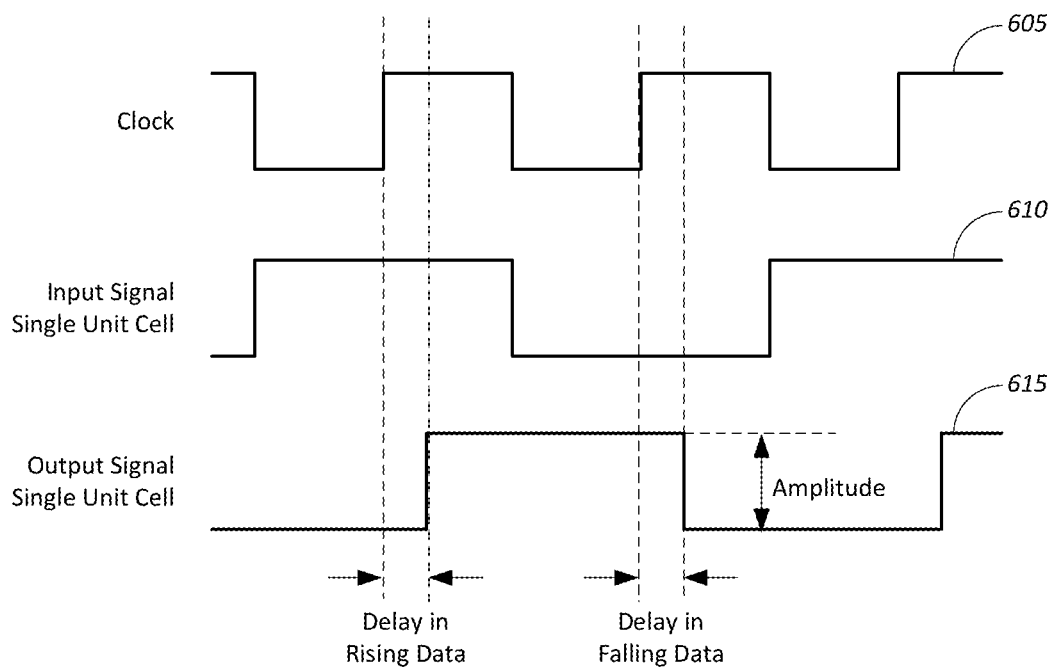
FIG. 6 is a timing diagram illustrating delays in an output signal from a DAC unit cell, in accordance with various embodiments.

FIG. 6 illustrates waveforms of an input digital signal 610 generated by a single DAC unit cell 505 from a clock signal 605 and the resulting analog output signal 615. As illustrated, the output signal 615 is characterized by an amplitude and by timing delays in rising data (a rising edge) and falling data (a falling edge). These characteristics can be calibrated, for example as described below, so that all of the cells 505 behave consistently, as noted above.

It should be noted at this point that the discussion of FIGS. 1-4 refers to measurement of a DAC output signal and calibration of a DAC. In some embodiments, a DAC 105 comprises a plurality of DAC unit cells 505, and the discussion of FIGS. 1-4 applies equally to the measurement of an output signal from, and calibration of, an individual DAC unit cell. For example, the procedure to calibrate an individual cell effectively isolates that cell from all other cells in the DAC, except perhaps for a reference cell, so the DAC output reflects the combined output of the DAC cell being calibrated (a duty cell) and the reference cell. Thus, in an aspect, calibration of all of the duty cells is equivalent to calibration of the DAC itself, and the signal paths and interference issues described with respect to FIGS. 1-4 apply equally to calibration of an individual unit cell.

Figure 7:
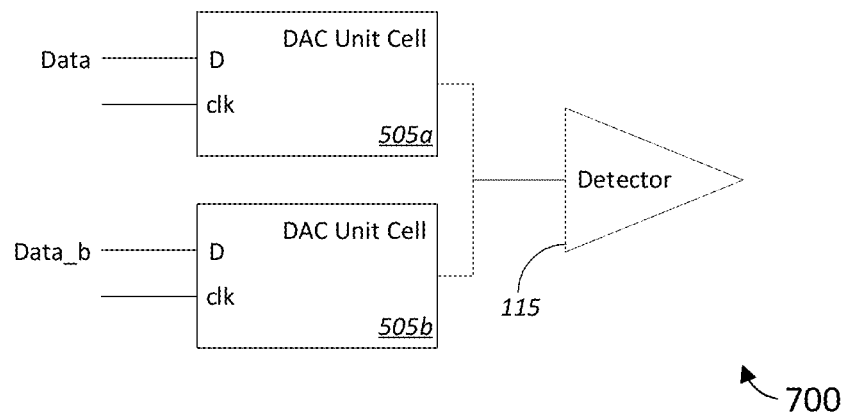
FIG. 7 is a block diagram of a DAC calibration system, in accordance with various embodiments.

To illustrate, FIG. 7 is a block diagram of a portion of a DAC calibration system, in accordance with various embodiments. In FIG. 7, output from two cells 505*a*, 505*b* are measured by a detector 115, which can act as a comparator between the two cells. As used herein, the term "measure" means any monitoring, detection, or measurement of signals and/or signal characteristics (such as those mentioned above) that can be used as part of a calibration process for a DAC and/or DAC unit cells. In different embodiments, measurement can include quantification of values, but that is not required unless expressly noted; instead a detector's measurement can be qualitative in nature (such as detecting a non-zero amplitude or a timing delay, regardless of the magnitude of either).

Figure 8:
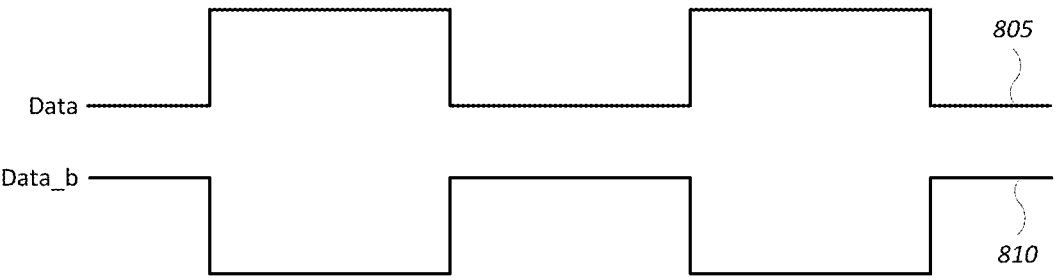
FIG. 8 is a timing diagram illustrating a signal and its additive inverse.

In some embodiments, the DAC unit cell 505*a* receives a positive digital "Data" signal as an input while another DAC unit cell 505*b* receives a signal "Data_b," which is an additive inverse of the "Data" signal. An example of a Data signal 805 and its additive inverse Data_b is shown by FIG. 8. As can be seen, if the Data signal 805 and the Data_b signal were summed, the resulting signal would be a flat (zero-amplitude) response. Assuming the output signals of cell 505*a* and cell 505*b* were perfectly calibrated, the combined analog output of the two cells 505*a*, 505*b* would be a flat line (with no edges and no amplitude). In practice, therefore, any characteristic errors (e.g., timing errors and/or amplitude errors) in either cell would result in a combined output signal that would have a non-zero amplitude after a rising edge (e.g., in the case of amplitude errors in one or both of the cells 505*a*, 505*b*) and/or one or more edges (e.g., in the case of timing errors in one or both of the cells, all of which can be measured by the detector. As used herein, the term "error" means any detectable discrepancy between one or more characteristics of an entity (e.g., a signal, DAC cell, etc.) and a corresponding standard characteristic. In some cases, errors might be absolute, but in many cases, errors represent differences between a characteristic of an entity (e.g., a signal) and a reference entity. For instance, if a reference cell produces a signal waveform with a particular delay or amplitude, that delay or amplitude is considered the standard with which another cell's signal is compared to determine whether an error exists. In an aspect, therefore, an error can be any case in which an entity does not match a corresponding entity (as the term "match" is used herein).

Returning to FIG. 7 briefly, it is worth noting that the detector 115 is shown at the output of the DAC 105 (as is illustrated in FIG. 2, for example). While this is possible in some embodiments (in particular those discussed in detail in the Incorporated Applications), it is also possible that the detector is physically or logically disposed at the chip output 125 (as shown in FIGS. 1 and 4), rather than at the output of the DAC 105 itself.

Figure 9:
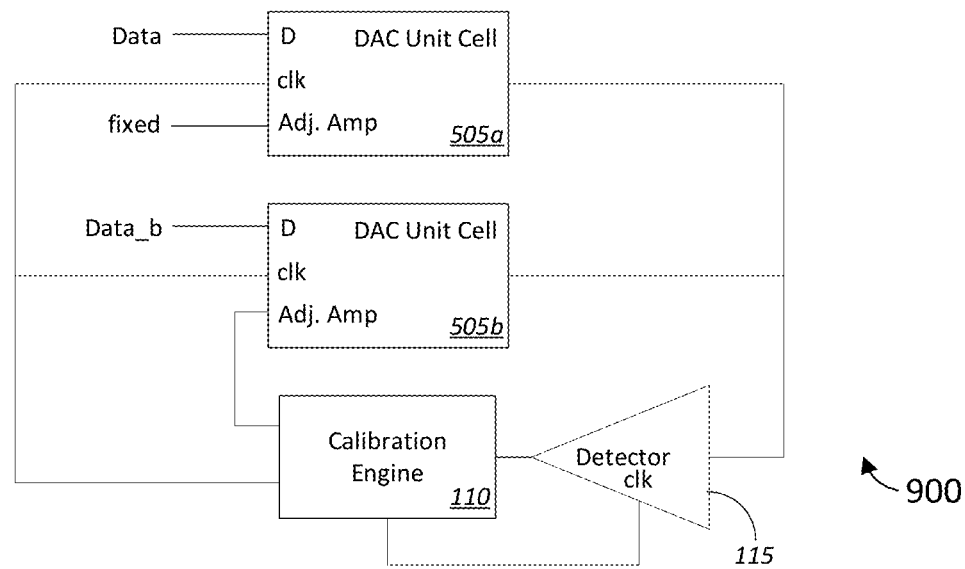
FIG. 9 is a block diagram of a DAC calibration system, in accordance with various embodiments.

FIG. 9 illustrates a calibration system 900 that can measure and compare output of a reference cell 505*a* and a duty cell 505*b*; the system can also calibrate the duty cell 505*b* based on the comparison of the respective output signals. Once again, it should be noted that FIG. 9 illustrates the detector 155 at the output of the DAC cells 505, but in some embodiments the detector 115 is located (physically and/or logically) at the chip output 125. The system 900 provides a Data signal to the reference cell 505*a* and Data_b signal (which, as explained above, represents the additive inverse signal of the Data signal) to the duty cell 505*b*. Each of the cells 505*a*, 505*b* also receives a clock signal to control the timing of the DAC unit cell. Each of the DAC unit cells 505*a* and 505*b* also include a calibration input (in this case, labeled Adj. Amp.). The calibration input can be used by the calibration engine 110 to adjust the characteristics (e.g., amplitude, timing, etc.) of a cell 505 to calibrate that cell as needed. Thus, in some embodiments, the calibration input may be variable and/or dynamic, based on the input received from the calibration engine 110. For example, in the illustrated embodiment, the duty cell 505b might receive a calibration input to adjust the amplitude of the output signal produced by that cell 505b.

In the illustrated embodiment, the calibration engine 110 receives input from the detector 115 and determines a calibration signal for the duty cell 505b, based on the input from the detector 115. The calibration engine 115 might continuously and/or periodically vary the calibration signal until the output signal from the duty cell 505b matches the output from the reference cell 505a to within a desired or specified tolerance is reduced to an acceptable range. After the calibration engine 115 determines that the calibration signal has adjusted the characteristics of the output signal produced by the duty cell 505b (e.g., amplitude and/or timing of the signal) to match those of the reference cell 505a as necessary, the calibration of that cell 505b is complete. The calibration signal from the calibration engine 110 can adjust, for instance, amplitude and timing of the output signal from the duty cell 505b. In some embodiments, for example, the calibration signal might adjust the gain of cell 505b to adjust amplitude or timing.

As noted, in the illustrated embodiment, the first DAC unit cell 505a is a reference cell, so it receives no calibration signal from the calibration engine; instead the Adj. Amp input might be fixed for that cell 505a. Being the reference cell, cell 505a does not require, in some embodiments, any calibration input because the characteristics of that cell 505a will not change during the calibration (except in cases, as discussed below, when the reference cell is being pre-calibrated before calibrating the duty cells; in such a case the reference cell temporarily might be considered a duty cell because it is being calibrated, and the duty cell therefore can serve the role of a reference cell in this situation).

Figure 10:
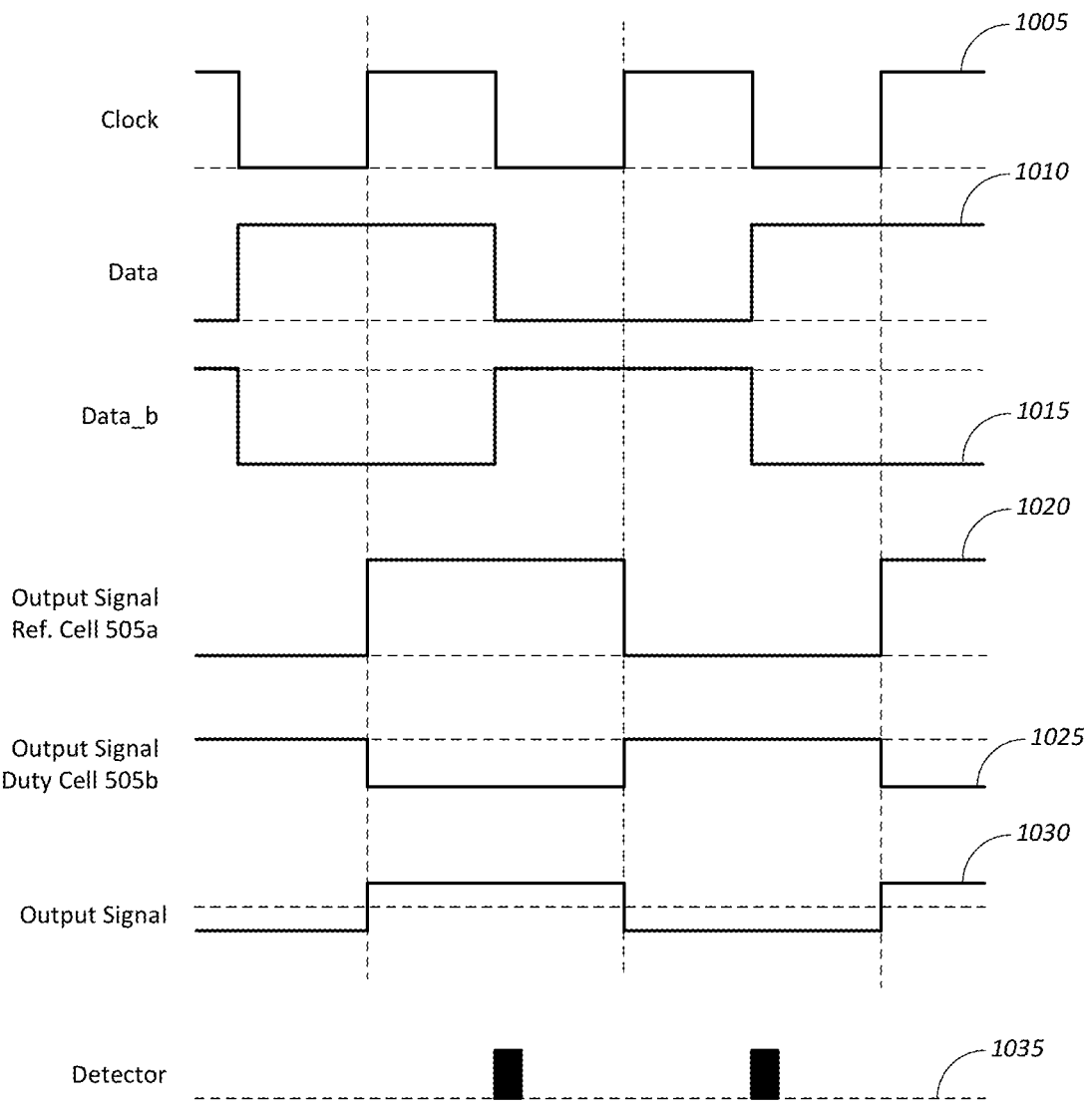
FIG. 10 is a timing diagram illustrating DAC output with two amplitude errors in an output signal of a DAC unit cell, in accordance with various embodiments.
Figure 11:
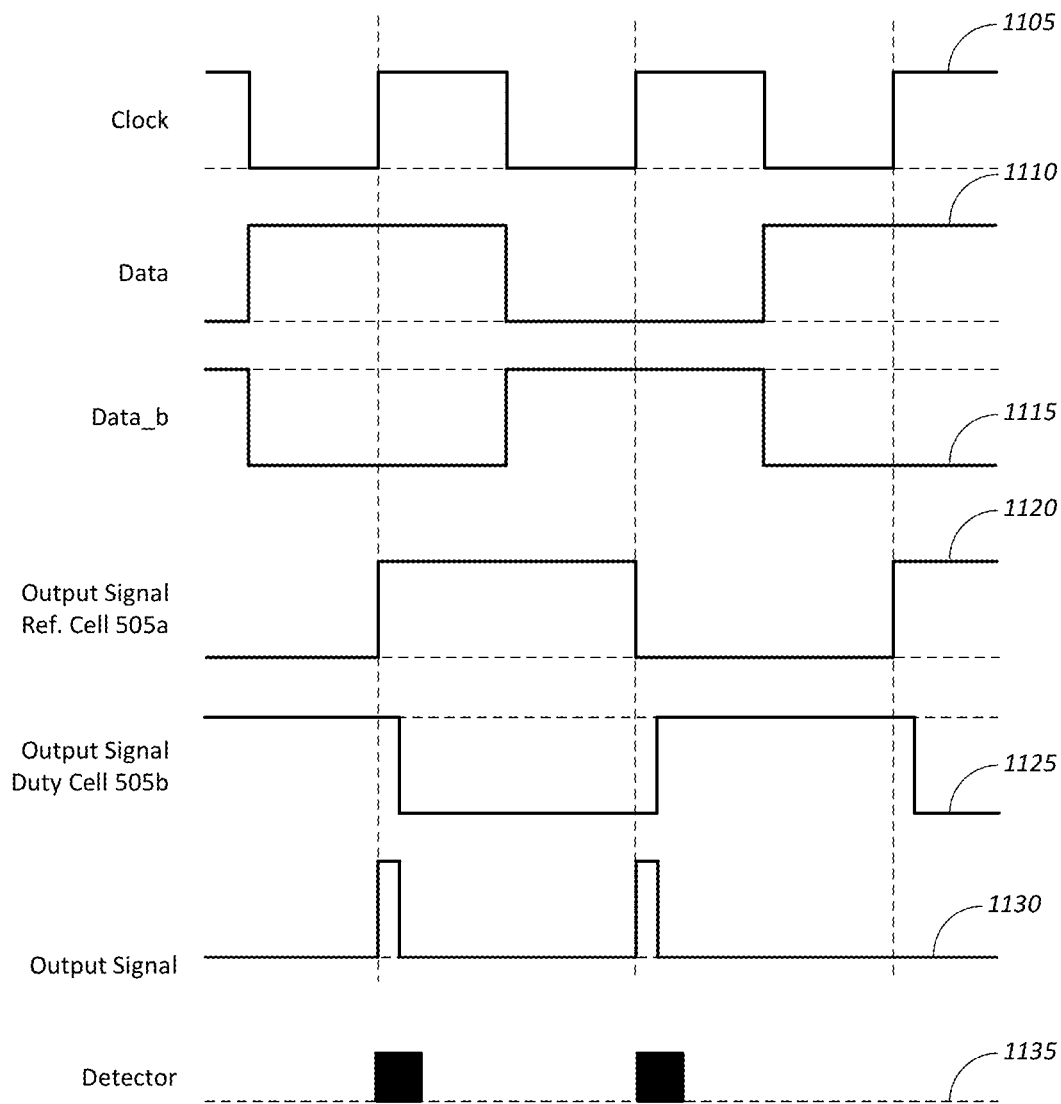
FIG. 11 is a timing diagram illustrating DAC output with two timing errors in an output signal of a DAC unit cell, in accordance with various embodiments.

To illustrate the operation of the calibration system of some embodiments in a couple of different situations, FIG. 10 illustrates a timing diagram 1000 of DAC unit cell (e.g., the duty cell 505b from FIG. 9) with an improperly calibrated amplitude, while FIG. 11 illustrates a similar timing diagram 1100 of a DAC unit cell (e.g., duty cell 505b) with improperly calibrated timing, as compared with a reference cell (e.g., cell 505a from FIG. 9).

In FIG. 10, a clock signal 1005 provides a clock timing for the DAC 105 (including in particular cells 505a and 505b). Data signal 1010 illustrates the data signal received by the reference cell 505a, while Data_b signal 1015 (the additive inverse of Data, as noted above), is received by the duty cell 505b. (Note that, in different embodiments, a reference cell can receive either the original Data signal or the inverse Data_b signal, while the duty cell receives the other. Various embodiments can be indifferent to which cell receives which signal.) Based on the clock 1005 and Data 1010 signals, the reference cell 505a produces output signal 1020. Likewise, the duty cell 505b produces output signal 1025 from the clock 1005 and Data_b 1010 signals. These two output signals 1020, 1025 are summed (additively combined) to produce DAC output signal 1030. (In some embodiments, during calibration, only two cells of a DAC are active—the reference cell 505a and a single duty cell 505b). This process can be repeated serially so that all duty cells (e.g., 505b) are calibrated against the same reference cell 505a). The DAC output 1030 has a non-zero amplitude (shown against the dashed axis). This means that cell 505a and cell 505b have an amplitude error with respect to one another. Because cell 505a is the reference cell, this condition will result in calibration to increase the amplitude of cell 505b to match (within the necessary tolerance) the amplitude of cell 505a. Detector 115 detects this mismatch and provides a control signal 1035 to the calibration engine 110 to indicate the amplitude differences. Based on this control signal and the designation of cell 505a as a reference, the calibration engine 110 will determine that the amplitude of cell 505b must be increased and will transmit an appropriate calibration input to the duty cell 505b. These detection and calibration procedures will be repeated until the calibration engine 110 determines that the amplitude of the duty cell 505b has been properly calibrated to match the reference cell 505a.

FIG. 11 illustrates the signals produced by a similar system when the timing of the duty cell 505b requires calibration to match that of the reference cell 505a. Based on the clock 1105 and Data 1110 signals, the reference cell 505a produces an output signal 1120 with the illustrated waveform. Likewise, the duty cell 505b produces an output signal 1125 with the illustrated waveform from the clock 1105 and (inverse) Data_b 1115 signals. The DAC output signal 1130 demonstrates rapid rising and falling edges due to the timing mismatch, and these edges are detected by the detector 115, which provides a control signal 1135 to the calibration engine 110, which then would send an appropriate calibration input to cell 505b to calibrate the timing of that cell. This process could be repeated until the timing of 505b has been calibrated to match that of cell 505a.

Figure 12:
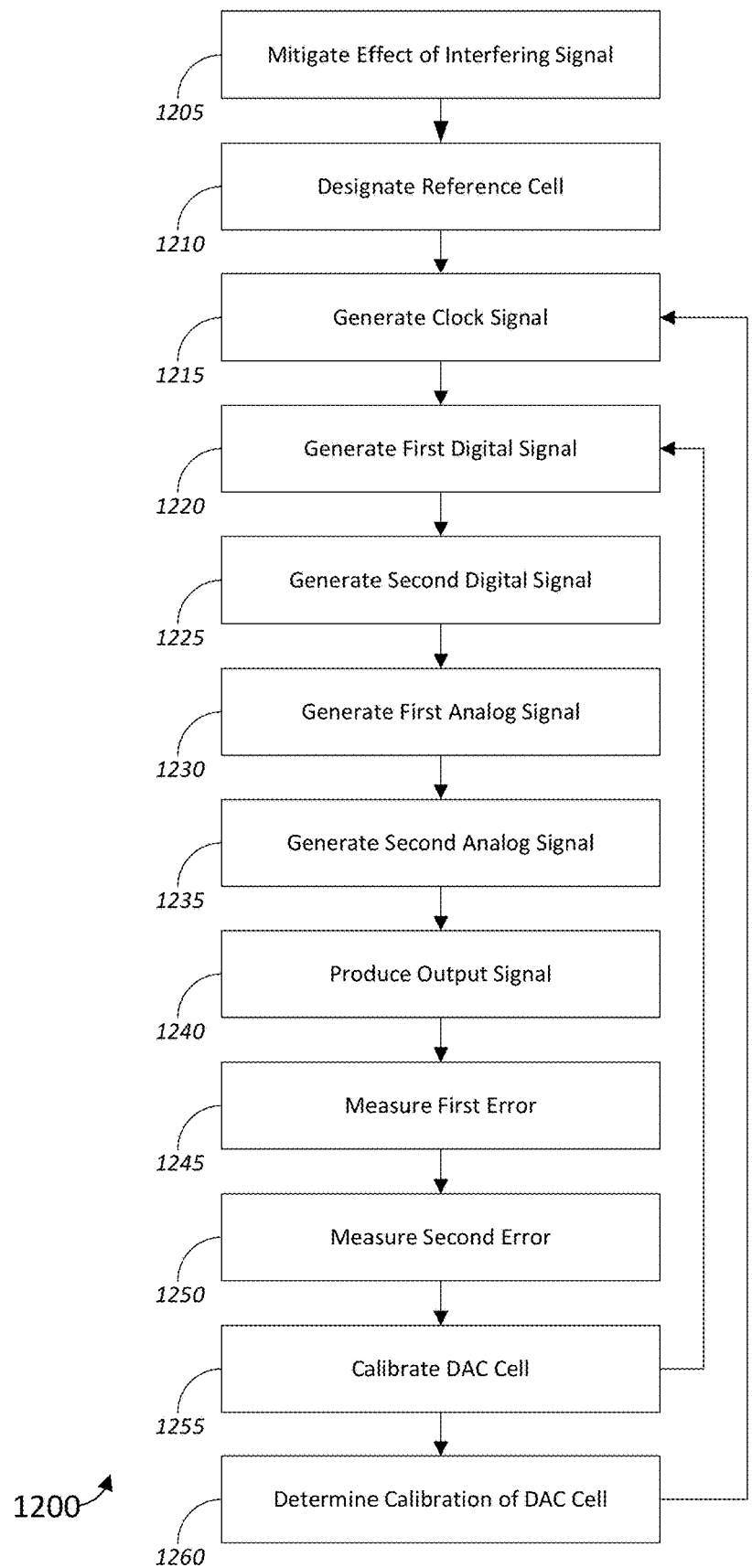
FIG. 12 is a flow diagram illustrating procedures for calibrating a DAC unit cell, in accordance with various embodiments.
Figure 13:
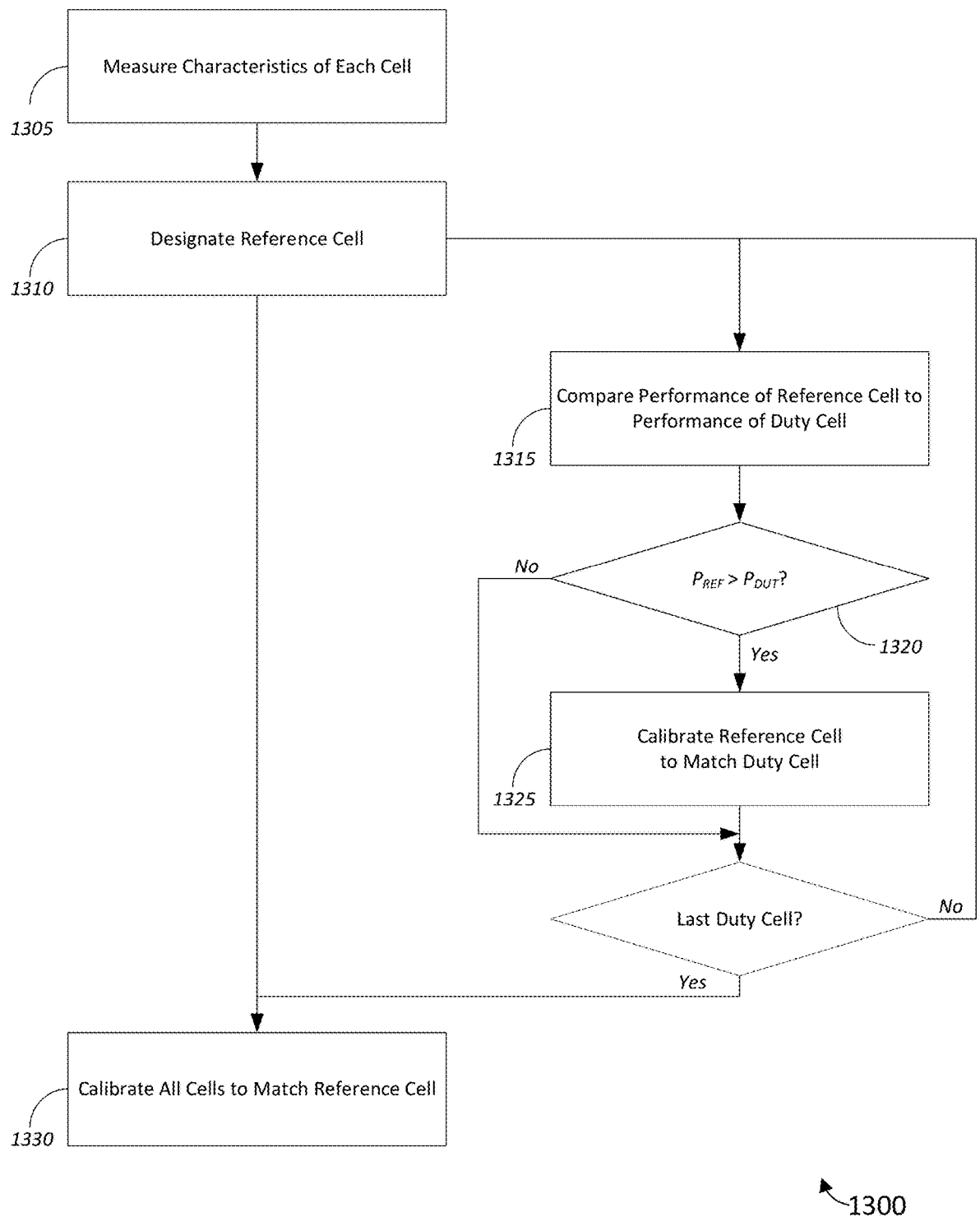
FIG. 13 is a flow diagram illustrating procedures for designating a reference cell and calibrating a plurality of duty cells, in accordance with various embodiments.

FIGS. 12 and 13 are flow diagrams illustrating various procedures for calibrating a DAC, in accordance with various embodiments. In particular, FIG. 12 illustrates a process 1200 that can be used specifically to calibrate a DAC cell without an isolation series switch, such as in the embodiment illustrated by FIG. 4. FIG. 13 illustrates a method 1300 that can be used to designate a reference cell and calibrate the remaining duty cells using the reference cell, thereby calibrating the DAC itself.

At block 1205, the method 1200 comprises mitigating the effect of an interfering signal, such as return loss (e.g., TDR, as described above). In particular embodiments, this includes establishing a clock signal (or clock signals) to control the DAC cells (e.g., the reference cell and the cell being calibrated) and the detector to produce and measure output signals with a timing that mitigates the effects of the interfering signal (e.g., as illustrated by FIG. 3B). This timing can be determined empirically within a particular chip/board combination, for example by calibrating the clock signal using a signal with known characteristics and determining a timing that allows proper detection of that signal's characteristics (e.g., timing, amplitude, etc.). In other cases, the return loss of particular board blocks might have known characteristics that enable setting the clock signal(s) a priori.

At block 1210, the method 1200 comprises designating a reference cell for calibration purposes. Exemplary procedures for designating a reference cell are described below and in the Incorporated Applications, but different embodiments can employ any suitable technique. For example, if a particular cell is known to have desired characteristics (e.g., characteristics to which other cells can be calibrated), that cell might designated as the reference a priori, and/or an external reference might be used instead of one of the DAC's internal DAC cells. This does not mean, however, that the best-performing cell necessarily is designated as the reference cell. In some embodiments, the worst-performing cell (using whatever desired output signal characteristic(s) as criteria) might be designated as the reference; merely by way of example, it might be more feasible to calibrate the remaining cells to match that poor performance than to calibrate the poorly performing cell to perform better. Thus, for example, a cell with the lowest value of amplitude or the highest (longest) value of delay (e.g., the combined delay of a rising edge and a falling edge) might be designated as the reference cell.

At block 1215, the method 1200 comprises generating the clock signal(s). In some embodiments, the calibration engine might generate a clock signal (as defined herein) and provide the clock signal(s) to the DAC cells and/or the detector. In other embodiments, a different component might generate the clock signals. Generally, however, the timing of the clock signal is configured, as noted above, to mitigate the effects of an interfering signal. As noted above, some embodiments might use a single clock signal for both the detector and the DAC.

At block 1220, the method 1200 comprises generating a first digital signal (e.g., a Data signal as described above), and at block 1225, the method comprises generating a second digital signal (e.g., a Data_b signal as described above). In an aspect, the calibration engine can generate these data signals and transmit them to a first DAC cell and a second DAC cell, while in some embodiments another component generates the signals. In certain embodiments, the calibration engine might include logic to generate the digital signals and/or to instruct another component to generate the signals. As noted above, in some cases, the second signal might be an inverse (e.g., an additive inverse) of the first signal. In some embodiments, the calibration engine controls the digital data signals to mitigate degradation from any interfering signal and perform calibration; for example, the calibration engine can send a data signal and an inverse signal to the DAC, or instruct another component to generate those signals, to compare two cells, as described above.

At block 1230, the first DAC cell generates a first analog signal based on the clock signal and the first digital signal, and at block 1235, the second DAC cell generates a second analog signal based on the clock and the first second signal, e.g., as described in the context of FIGS. 10 and 11. At block 1240, the DAC produces (e.g., generates) an output signal, e.g., by summing the first analog signal and the second analog signal.

At block 1245, the method 1200 comprises measuring (e.g., detecting) a first error in the output signal, e.g., as described in the context of FIGS. 10 and 11. In an aspect, this error is measured at the output of the chip in which the DAC is packaged, rather than at the output of the DAC itself. As noted, some embodiments eliminate the need for an isolation switch (and therefore allow measurement of the signal errors at the chip output, e.g., the interface with the package and the board). In some embodiments, the method 1200 comprises measuring a second error in the output signal (block 1250); this error also can be measured at the chip output, rather than the DAC output. Based on the detected error(s), the detector can send a control signal to the calibration engine.

At block 1255 the method includes calibration of the DAC cell. In some embodiments, the calibration engine analyzes the control signal from the detector and determines an appropriate calibration input for the DAC cell being calibrated. This calibration input will cause that DAC cell to change one or more characteristics (e.g., amplitude, timing, etc.) of its operation. This process can be repeated from block 1220 until the calibration engine has determined an appropriate calibration signal to cause the cell being calibrated to match the reference cell. At this point, the method 1200 includes determining that the DAC cell has been calibrated (block 1260). In some embodiments, the method of FIG. 13 can be used to select the reference cell, e.g., in the manner described above), and calibrate all of the cells in the DAC (e.g., by reiterating the method 1200 from block 1215) until all of the cells have been calibrated.

FIG. 13 is a flow diagram depicting a method 1300 of designating a reference cell and using that reference cell to calibrate the remaining cells of the DAC (referred to herein as duty cells to distinguish from the reference cell) in accordance with an embodiment. In some embodiments, the method 1300 is performed by a DAC calibration system, e.g., the system 900 of FIG. 9. In other embodiments, the method 1300 is performed by other entities. In some embodiments, the process 1300 includes more, fewer, or different blocks than shown in FIG. 13.

At block 1310, method 1300 comprises designating one of a plurality of DAC unit cells in a DAC as a reference cell. As mentioned above, a reference cell may be defined as the DAC unit cell that is used as a reference to calibrate other cells within the DAC. In some embodiments, the performance of each of the DAC cells might be measured prior to calibration (block 1305), and/or the cell with the worst performance with regard to the characteristic(s) being calibrated might be designated as the reference cell. For instance, the cell that produces the signal with the worst (lowest) amplitude and/or the worst (longest) delay might be designated as the reference cell. In some embodiments, the output signals of each of the cells might be measured (e.g., with a detector) prior to calibration to determine the worst performing cell and thereby designate that cell as the reference cell.

In other embodiments, the reference cell may be designated arbitrarily, with any DAC unit cell having an equal chance of being designated as the reference cell. For example, it might be difficult to accurately measure the characteristics of a cell's output signal in a vacuum, such that it is more feasible to compare two cells to determine the better performing cell than to measure the performance of each cell on its own.

In such cases, the arbitrarily chosen reference cell can be pre-calibrated to ensure that it has the worst performance of all of the cells. In an embodiment, the performance of the reference cell can be compared to that of each of the other cells in the DAC. For example, the method can include comparing the characteristic(s) of interest (e.g., amplitude, delay, etc.) of a single duty cell's output signal with the corresponding characteristic(s) of the reference cell's output signal (block 1315). In some embodiments, the techniques described above (e.g., in the context of FIGS. 7-9) can be used to perform this comparison.

If the performance of the reference cell is determined (at block 1320) to be worse than that of the duty cell (e.g., the reference signal has a lower amplitude, longer delay, etc. than the duty cell's output signal), the method can include calibrating the reference cell to match the duty cell (block 1325). In either case, if the current duty cell is not the last duty cell to be compared to the reference cell, method reiterates from block 1315 until the reference cell has been compared with all duty cells. As a result, because the performance of the reference cell has been successively calibrated to match each duty cell with lower performance, the reference cell will have the worst performance of all of the cells.

Once the reference cell is established as the worse performing cell (either a priori or using the pre-calibration technique of blocks 1315-1325, the method 1200 comprises calibrating all of the duty cells to match the reference cell (block 1330). In some embodiments, the procedures described above (including without limitation those described in connection with FIG. 12) can be used to perform the calibration of each duty cell.

Thus, various embodiments comprise devices and/or methods for calibrating a DAC. Exemplary devices can include integrated circuits, systems on a chip (SoC), transmitters, and/or network devices that comprise a DAC.

In some embodiments, a DAC can be employed for wireless communication. For example, the DAC can be implemented in a transmitter for a radio frequency (RF) communication, such as a cellular communication (3G, 4G, 5G, 6G, etc.), Wi-Fi communication, Bluetooth communication, etc. In some embodiments, the transmitter is a transmitter of a base station, access point, central device in a Bluetooth system, etc. that provides a wireless communication. In other cases, the DAC might be implemented in a transmitter of a wireless user device, such as a mobile phone, personal computer, and/or the like, and/or in a peripheral device in a Bluetooth system. In one aspect, the DAC may operate at a high speed (e.g., over 5 Gbps), and may convert a modulated signal at radio frequency in a digital representation into an analog signal in an analog representation. The DAC may provide the analog signal to a preamplifier or a power amplifier for transmission through an antenna, such that an analog upconverter or an analog mixer can be omitted. By omitting the analog upconverter or the analog mixer, the transmitter can reduce power consumption, and can be implemented in a small form factor. Moreover, modulation or upconversion of a signal in a baseband frequency (e.g., 100 MHz-1 GHz) to a RF frequency (1-10 GHz) can be performed by a digital logic circuit that may be less susceptible to noise than an analog circuit, such that the transmitter can provide a signal with a higher signal integrity. In other embodiments, a DAC can be implemented for different applications. For example, the DAC disclosed herein can be implemented for a wired communication, an optical communication, or any computing or electronic device that performs digital-to-analog conversion (e.g., high speed digital-to-analog conversion), such as a digital receiver, audio mixer, preamplifier, etc.

Thus, a set of embodiments provides transmitters, for example. An exemplary transmitter might comprise a DAC, which might comprise a first DAC unit cell that generates a first signal based on a first digital signal and a clock signal. In some embodiments, the DAC comprises a second DAC unit cell that generates a second signal based on a second digital signal and the clock signal. In an aspect, the second output signal can be a reference signal. In another aspect, the second digital signal can be an inverse of the first digital signal. In some embodiments, the transmitter comprises one or more electronic components disposed after the DAC on a signal path and/or an output stage disposed on the signal path after the one or more electronic components.

In a set of embodiments, the transmitter comprises circuitry to produce an output signal by summing the first signal and the second signal and/or circuitry to measure a first error in the first signal at the output stage of the device. This measurement can occur after a first edge of the output signal has passed through the one or more electronic components between the DAC and the output stage on the signal path. The measure might occur before an interfering signal is received at the output stage; in some embodiments, the interfering signal comprises a time domain TDR generated by a balun in response to the output signal.

The transmitter might further comprise circuitry to generate the clock signal to cause the first and second DAC unit cells to generate the first and second signals to produce a second edge in the output signal to be measured after the balun has become inductive and the interfering signal has diminished. The transmitter can comprise further circuitry to measure a second error of the first signal at the output stage of the device, after the balun has become inductive and the interfering signal has diminished. In some cases, the transmitter comprises circuitry to calibrate the first DAC unit cell, based at least in part the measurement of the first error and the second error, wherein the first and second errors are timing errors or amplitude errors.

A device in accordance with another set of embodiments might comprise a DAC that generates an analog output signal along a signal path. The output signal might comprise a first signal. In an aspect, the DAC comprises a first DAC unit cell, which might generate the first signal based on a first digital signal and a clock signal. In another aspect, the first signal can have a first edge and a second edge; the first edge might be a rising edge, and the second edge might be a falling edge.

The device might comprise one or more electronic components disposed after the DAC on the signal path and/or might comprise an output stage disposed on the signal path after the one or more electronic components.

In some embodiments, the device comprises a calibration engine. The calibration engine can comprise logic to calibrate the first DAC unit cell, based on measurement of the output signal at the output stage of the device, after the output signal has passed through the one or more components on the signal path. The calibration can further comprise logic to measure the output signal, which can include logic to mitigate an effect of an interfering signal on measurements of the first signal. In some cases, this includes logic to measure the first edge before the interfering signal is received at the output stage and/or logic to generate the clock signal to cause the first DAC unit cell to generate the first signal to produce the second edge occurs after the interfering signal has diminished.

For example, the interfering signal might comprise a time domain reflection generated by a balun in response to the first signal. In such cases, the logic to generate the clock signal to cause the first DAC unit cell to generate the first signal to produce the second edge occurs after the interfering signal has diminished can comprise logic to generate the clock signal to cause the first DAC unit cell to generate the first signal to produce the second edge occurs after the balun has become inductive.

In some cases, the DAC might further comprise a reference DAC unit cell. In some cases, the reference cell generates a reference signal based on a second digital signal and a clock signal; the output signal might comprise the first signal and the reference signal. For instance, the output signal might comprise the sum of the first signal and the second signal. In some cases, the device includes logic to generate the first digital signal; logic to generate the second digital signal as an additive inverse of the first digital signal.

In some cases, the DAC comprises a plurality of DAC unit cells, which comprises the first DAC unit cell. In such cases, the calibration engine might comprise logic to calibrate each of the plurality of DAC unit cells, based on measurement of the respective output signal comprising the respective signal generated by that DAC unit cell and the reference signal generated by the reference DAC unit cell. The plurality of DAC unit cells might also comprise the reference cell.

In a set of embodiments, the logic to calibrate each of the plurality of DAC unit cells comprises logic to designate one of the plurality of DAC unit cells as the reference DAC unit cell with a first value. The first value can have a lowest or highest value of the signals generated by the plurality of DAC unit cells. The logic to calibrate each of the plurality of DAC unit cells can further comprise logic to calibrate a remainder of the plurality of DAC unit cells (e.g., duty cells) to match the first value. In some cases, the value is a delay value comprising a sum of a first delay value of the first edge and a second delay value of the second edge of each signal; the first value could be a highest or lowest delay value from among the delay values of the signals produced by the plurality of cells. In other cases, the value is an amplitude value of each signal, and wherein the first value could be a lowest or highest amplitude value from among the amplitude values of the signals produced by the plurality of cells.

In some cases, the device might be an integrated circuit, an SoC, or the like. In other cases, the device might comprise a transmitter. In such cases, the transmitter might comprise the DAC, the one or more additional electronic components, the calibration engine, a balun, and/or a power amplifier. In some cases the device might be a wireless communication device comprising the transmitter.

Various methods in accordance with a set of embodiments might comprise operations corresponding to some or all of the circuitry and/or logic of device described above. By way of example, a method might comprise generating, with a first digital to analog converter (DAC) unit cell of a DAC, a first signal on a signal path. The first signal might be generated based on a first digital signal and a clock signal. The first signal has a first edge and a second edge. The method might also comprise measuring the first signal at an output stage, after the signal has passed through one or more electronic components on the signal path between the DAC and the output stage. In some embodiments, the method comprises calibrating the first DAC unit cell, based on measurement of the output signal at the output stage of the device.

As used here, the term "logic" includes, without limitation, any hardware, software, or firmware instructions that cause a component to perform operations in accordance with various embodiments. In some cases, the logic might include firmware or software instructions that are performed by a processor. The term "processor" is used generally herein to refer to include one or more of a central processing unit, a graphics processing unit, a microprocessor, a controller, a microcontroller, a digital signal processor (DSP), programmable logic (such as a field-programmable gate array (FPGA), an erasable programmable logic device (EPLD), or the like), an application-specific integrated circuit (ASIC), a system on a chip (SoC) and/or another type of processing component. Such a processor can be implemented in hardware, firmware, or a combination of hardware, firmware and/or software. In some implementations, a processor can include one or more processors capable of being programmed to perform one or more operations or processes described elsewhere herein.

In particular, logic can be any sort of code, instructions, circuitry, or the like that can cause a component or group of components to operate in accordance with the embodiments herein (e.g., to perform some or all of the processes and/or operations described herein). Merely by way of example, logic can include the instructions, which might be stored on nonvolatile storage, loaded into working memory and/or executed by a processor to perform operations and methods in accordance with various embodiments. In an aspect, these instructions can be considered to be programming a processor to operate according to such embodiments.

Alternatively, and/or additionally, logic can include circuitry (e.g., hardware or firmware), which can operate independently of, or collaboratively with, any processor that a device in accordance with the various embodiments might or might not have. (As noted above, in some cases, circuitry itself can be considered a processor.) The circuitry might be embodied as one or more circuits of individual electrical components, which can be relatively more or less integrated. Such circuitry can include, merely by way of example, an individual circuit, a collection of integrated circuits, a chip, a SoC, an ASIC, a programmable logic device (FPGA, EPLD, etc.), and/or the like. Thus, some or all of the logic enabling or causing the performance of some, or all of the operations described herein might be encoded in hardware circuitry and executed directly by such circuitry. (In some cases, this functionality can be embodied by hardware instructions).

In further detail, one or more components (including but not limited to logic) can be embodied as one or more transistors. The transistors implemented may be N-type transistors or P-type transistors. The transistors can be any suitable type of transistors including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel. In one aspect, a transistor includes a source electrode, a drain electrode, and a gate electrode. A source electrode and a drain electrode can be interchangeable, according to voltages applied to the source electrode and the drain electrode. Hence, a source electrode and a drain electrode can be referred to as source/drain electrodes herein. According to a voltage applied to a gate electrode of the transistor, the current may flow between a source electrode and a drain electrode. In certain application, a transistor can be implemented as a switch. For example, if a voltage difference between a gate electrode and a source electrode of a transistor is larger than a threshold voltage of the transistor, the transistor can be enabled to electrically couple between the source electrode and the drain electrode of the transistor. For example, if a voltage difference between a gate electrode and a source electrode of a transistor is less than a threshold voltage of the transistor, the transistor can be disabled to electrically decouple between the source electrode and the drain electrode of the transistor.

Thus, unless the context dictates otherwise, embodiments described herein are not limited to any specific combination of hardware, firmware, and/or software.

CONCLUSION

In the foregoing description, for the purposes of explanation, numerous details are set forth to provide a thorough understanding of the described embodiments. It will be apparent to one skilled in the art, however, that other embodiments may be practiced without some of these details. In other instances, structures and devices are shown in block diagram form without full detail for the sake of clarity. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Thus, the foregoing description provides illustration and description of some features and aspect of various embodiments, but it is not intended to be exhaustive or to limit the implementations to the precise form disclosed. One skilled in the art will recognize that modifications may be made in light of the above disclosure or may be acquired from practice of the implementations, all of which can fall within the scope of various embodiments. For example, as noted above, the methods and processes described herein may be implemented using software components, firmware and/or hardware components, (including without limitation processors, other hardware circuitry, custom integrated circuits (ICs), programmable logic, etc.) and/or any combination thereof.

Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Likewise, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods does not limit the implementations unless specifically recited in the claims below. Thus, when the operation and behavior of the systems and/or methods are described herein without reference to specific software code, one skilled in the art would understand that software and hardware can be used to implement the systems and/or methods based on the description herein.

In this disclosure, when an element is referred to herein as being "connected" or "coupled" to another element, it is to be understood that one element can be directly connected to the other element or have intervening elements present between the elements. In contrast, when an element is referred to as being "directly connected" or "directly coupled" to another element, it should be understood that no intervening elements are present in the "direct" connection between the elements. However, the existence of a direct connection does not preclude other connections, in which intervening elements may be present. Similarly, while the methods and processes described herein may be described in a particular order for ease of description, it should be understood that, unless the context dictates otherwise, intervening processes may take place before and/or after any portion of the described process, and, as noted above, described procedures may be reordered, added, and/or omitted in accordance with various embodiments.

In this application, the use of the singular includes the plural unless specifically stated otherwise, and use of the term "and" means "and/or" unless otherwise indicated. Also, as used herein, the term "or" is intended to be inclusive when used in a series and also may be used interchangeably with "and/or," unless explicitly stated otherwise (e.g., if used in combination with "either" or "only one of"). Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise. As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

Unless otherwise indicated, all numbers used herein to express quantities, dimensions, and so forth should be understood as being modified in all instances by the term "about." As used herein, the articles "a" and "an" are intended to include one or more items and may be used interchangeably with "one or more." Similarly, as used herein, the article "the" is intended to include one or more items referenced in connection with the article "the" and may be used interchangeably with "the one or more." As used herein, the term "set" is intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. In the foregoing description, satisfying a threshold may, depending on the context, refer to a value being greater than the threshold, greater than or equal to the threshold, less than the threshold, less than or equal to the threshold, equal to the threshold, and/or the like, depending on the context.

Although particular combinations of features are recited in the claims and/or disclosed in the specification, these combinations are not intended to limit the disclosure of various implementations. In fact, many of these features may be combined in ways not specifically recited in the claims and/or disclosed in the specification. Thus, while each dependent claim listed below may directly depend on only one claim, the disclosure of various implementations includes each dependent claim in combination with every other claim in the claim set. No element, act, or instruction used herein should be construed as critical or essential unless explicitly described as such.

The invention claimed is:

1. A transmitter, comprising:
a digital to analog converter (DAC), the DAC comprising:
a first DAC unit cell that generates a first analog signal based on a first digital signal and a clock signal;
a second DAC unit cell that generates a second analog signal based on a second digital signal and the clock signal, the second DAC unit cell being designated as a reference cell, the second analog signal being a reference signal, and the second digital signal being an additive inverse of the first digital signal;
one or more electronic components disposed after the DAC on a signal path;
an output stage disposed on the signal path after the one or more electronic components;
circuitry to produce an output signal by summing the first signal and the second signal;
circuitry to measure a first error in the first signal at the output stage of the device, after a first edge of the output signal has passed through the one or more electronic components between the DAC and the output stage on the signal path, and before an interfering signal is received at the output stage, the interfering signal comprising a time domain reflection (TDR) generated by a balun in response to the output signal;
circuitry to generate the clock signal to cause the first and second DAC unit cells to generate the first and second signals to produce a second edge in the output signal to be measured after the balun has become inductive and the interfering signal has diminished;
circuitry to measure a second error of the first signal at the output stage of the device, after the balun has become inductive and the interfering signal has diminished; and
circuitry to calibrate the first DAC unit cell, based at least in part on the measurement of the first error and the second error, wherein the first and second errors are timing errors or amplitude errors.

2. A device, comprising:
a digital to analog converter (DAC) that generates an analog output signal along a signal path, the output signal comprising a first signal and a reference signal, the DAC comprising:
a first DAC unit cell that generates the first signal based on a first digital signal and a clock signal, the first signal having a first edge and a second edge; and
a reference DAC unit cell that generates the reference signal based on a second digital signal and the clock signal;
one or more electronic components disposed after the DAC on the signal path;
an output stage disposed on the signal path after the one or more electronic components;
a calibration engine comprising:
logic to calibrate the first DAC unit cell, based on measurement of the output signal at the output stage of the device, after the output signal has passed through the one or more electronic components on the signal path.

3. The device of claim 2, wherein the calibration engine further comprises:
logic to measure the output signal.

4. The device of claim 3, wherein the first edge is a rising edge, and the second edge is a falling edge.

5. The device of claim 3, wherein the logic to measure the first output signal comprises:
logic to mitigate an effect of an interfering signal on measurements of the output signal.

6. The device of claim 5, wherein the logic to mitigate the effect of the interfering signal comprises:
logic to measure the first edge before the interfering signal is received at the output stage.

7. The device of claim 5, wherein the logic to mitigate the effect of the interfering signal comprises:
logic to generate the clock signal to cause the first DAC unit cell to generate the first signal to produce the second edge after the interfering signal has diminished.

8. The device of claim 7, wherein:
the interfering signal comprises a time domain reflection (TDR) generated by a balun in response to the first signal; and
the logic to generate the clock signal to cause the first DAC unit cell to generate the first signal to produce the second edge after the interfering signal has diminished comprises:
logic to generate the clock signal to cause the first DAC unit cell to generate the first signal to produce the second edge after the balun has become inductive.

9. The device of claim 2, further comprising:
logic to generate the first signal;
logic to generate a second digital signal as an additive inverse of the first digital signal.

10. The device of claim 2, wherein the device is an integrated circuit.

11. The device of claim 2, further comprising a transmitter, the transmitter comprising:
the DAC;
the one or more additional electronic components;
the calibration engine;
a balun; and
a power amplifier.

12. The device of claim 11, wherein the device is a wireless communication device comprising the transmitter.

13. The device of claim 2, wherein:
the DAC comprises a plurality of DAC unit cells, the plurality of DAC unit cells comprising the first DAC unit cell;
the calibration engine comprises logic to calibrate each of the plurality of DAC unit cells, based on measurement of the respective output signal comprising the respective signal generated by that DAC unit cell and the reference signal generated by the reference DAC unit cell.

14. The device of claim 13, wherein the plurality of DAC unit cells comprises the reference DAC unit cell.

15. The device of claim 14, wherein the logic to calibrate each of the plurality of DAC unit cells comprises:
logic to designate one of the plurality of DAC unit cells as the reference DAC unit cell based on a first value of a first characteristic of a reference signal output by the reference DAC cell;
logic to calibrate a remainder of the plurality of DAC unit cells to output signals that match the first value of the first characteristic of the reference signal.

16. The device of claim 15, wherein the first characteristic is a delay of the reference signal, and wherein the first value comprises a sum of a first delay of the first edge and a second delay of the second edge of the reference signal.

17. The device of claim 15, wherein the first characteristic is an amplitude of the output signal of the first DAC unit cell.

18. The device of claim 15, wherein the first value indicates that the reference cell performs more poorly than any of the other plurality of DAC unit cells with respect to the first characteristic.

19. A method, comprising:
   generating, with a first digital to analog converter (DAC) unit cell of a DAC, a first signal on a signal path, based on a first digital signal and a clock signal, the first signal having a first edge and a second edge;
   generating, with a reference DAC unit cell, a reference signal based on a second digital signal and the clock signal;
   generating an analog output signal comprising the first signal and the reference signal;
   measuring, at an output stage of a device comprising the DAC, the first output signal, after the output signal has passed through one or more electronic components on the signal path between the DAC and the output stage of the device comprising the DAC; and
   calibrating the first DAC unit cell, based on measurement of the output signal at the output stage of the device comprising the DAC.

20. The method of claim 19, further comprising:
   mitigating an effect of an interfering signal on measurements of the output signal.

\* \* \* \* \*